(12) United States Patent
Nakano et al.

(10) Patent No.: US 8,791,568 B2
(45) Date of Patent: Jul. 29, 2014

(54) SEMICONDUCTOR DEVICE

(75) Inventors: Seiya Nakano, Tokyo (JP); Yoshifumi Tomomatsu, Tokyo (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 13/410,658

(22) Filed: Mar. 2, 2012

(65) Prior Publication Data

US 2012/0306079 A1 Dec. 6, 2012

(30) Foreign Application Priority Data

May 31, 2011 (JP) ................................ 2011-122135

(51) Int. Cl.
*H01L 23/48* (2006.01)
*H01L 23/00* (2006.01)

(52) U.S. Cl.
CPC ............. *H01L 24/48* (2013.01); *H01L 2224/48* (2013.01); *H01L 2224/05124* (2013.01); *H01L 24/05* (2013.01); *H01L 2224/02166* (2013.01)
USPC ........... 257/741; 257/734; 257/773; 257/776; 257/E23.019; 257/E23.02

(58) Field of Classification Search
USPC .............. 257/734, 741, 773, 776, E23.019, 257/E23.02
See application file for complete search history.

(56) References Cited

U.S. PATENT DOCUMENTS

| | | | | |
|---|---|---|---|---|
| 3,942,187 A | * | 3/1976 | Gelsing et al. | 257/751 |
| 4,394,678 A | * | 7/1983 | Winchell et al. | 257/737 |
| 5,136,364 A | * | 8/1992 | Byrne | 257/751 |
| 6,528,881 B1 | * | 3/2003 | Tsuboi | 257/738 |
| 2005/0200011 A1 | * | 9/2005 | Standing et al. | 257/736 |
| 2010/0164112 A1 | * | 7/2010 | Hishida et al. | 257/761 |

FOREIGN PATENT DOCUMENTS

| | | |
|---|---|---|
| DE | 101 06 564 A1 | 8/2002 |
| EP | 0 349 001 A2 | 1/1990 |
| JP | 2-12950 A | 1/1990 |
| JP | 3-153048 A | 7/1991 |
| JP | 5-343466 A | 12/1993 |
| JP | 2000-299342 A | 10/2000 |
| JP | 2005-72203 A | 3/2005 |
| JP | 2006-49427 | 2/2006 |
| JP | 2009-76703 | 4/2009 |

OTHER PUBLICATIONS

Office Action issued Jul. 22, 2013 in German Patent Application No. 10 2012 208 246.8 (with English-language translation).
Office Action issued Aug. 13, 2013 in Japanese Patent Application No. 2011-122135 (with partial English-language translation).
Japanese Office Action issued Jun. 3, 2014 in Japanese Patent Application No. 2011-122135, with English translation.

* cited by examiner

*Primary Examiner* — Peniel M Gumedzoe
(74) *Attorney, Agent, or Firm* — Oblon, Spivak, McClelland, Maier & Neustadt, L.L.P.

(57) ABSTRACT

A semiconductor device includes a substrate, a surface electrode of aluminum-containing material formed on the substrate, a metal film of solderable material formed on the surface electrode, and an end-securing film securing an end of the metal film and having a portion on the surface electrode and also having an overlapping portion which is formed integrally with the portion on the surface electrode and which overlaps the end of the metal film.

7 Claims, 3 Drawing Sheets

SEMICONDUCTOR DEVICE

BACKGROUND OF THE INVENTION

1. Field of the Invention

The present invention relates to a semiconductor device used, e.g., for high power switching.

2. Background Art

Japanese Laid-Open Patent Publication No. 2009-076703 discloses a semiconductor device having a surface electrode of aluminum formed on the surface of its semiconductor substrate. A metal film is formed on the surface electrode. Wires are soldered to the metal film.

Since the adhesion between the surface electrode and the metal film is high, when the semiconductor device is subjected to thermal stress, stress concentration occurs at the ends of the metal film. The stress at the ends of the metal film may damage the portions of the surface electrode immediately underlying these ends. If the surface electrode is damaged, it is not possible to ensure sufficient reliability of the semiconductor device.

SUMMARY OF THE INVENTION

The present invention has been made to solve this problem. It is, therefore, an object of the present invention to provide a semiconductor device in which damage to the surface electrode can be prevented.

According to one aspect of the present invention, a semiconductor device includes a substrate, a surface electrode of aluminum-containing material formed on the substrate, a metal film of solderable material formed on the surface electrode, and an end-securing film securing an end of the metal film and having a portion on the surface electrode and also having an overlapping portion which is formed integrally with the portion on the surface electrode and which overlaps the end of the metal film.

According to another aspect of the present invention, a semiconductor device includes a substrate, a surface electrode of aluminum-containing material formed on the substrate, a protective film formed on the surface electrode, and a metal film formed of solderable material and having a portion on the surface electrode and also having a riding-up portion which is formed integrally with the portion on the surface electrode and which overlies an end of the protective film.

Other and further objects, features and advantages of the invention will appear more fully from the following description.

DETAILED DESCRIPTION OF THE PREFERRED EMBODIMENTS

First Embodiment

Figure 1:
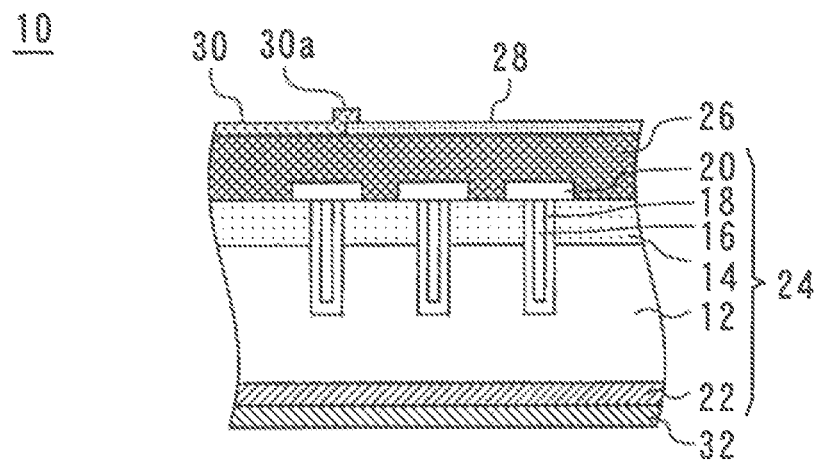
FIG. 1 is a cross-sectional view of a semiconductor device in accordance with a first embodiment of the present invention.

FIG. 1 is a cross-sectional view of a semiconductor device 10 in accordance with a first embodiment of the present invention. The semiconductor device 10 includes an epitaxial layer 12. A base layer 14 is formed on the top surface of the epitaxial layer 12. Polysilicon gates 16 are formed to penetrate through the base layer 14. Each polysilicon gate 16 is covered with a gate oxide film 18 and connected to a gate 20. A collector layer 22 is formed on the bottom surface of the epitaxial layer 12. The entire structure described above is referred to herein as the substrate 24.

A surface electrode 26 of a material containing 95% or more of aluminum is formed on the substrate 24. A metal film 28 of solderable material is formed on the surface electrode 26. The metal film 28 is formed of a plurality of metals other than aluminum. An end-securing film 30 of polyimide is also formed on the surface electrode 26. The end-securing film 30 has a portion on the surface electrode 26 and also has an overlapping portion 30a which is formed integrally with the portion on the surface electrode 26 and which overlaps the ends of the metal film 28. The end-securing film 30 is used to secure the ends of the metal film 28.

In the semiconductor device 10 of the first embodiment, the ends of the metal film 28 are covered with the overlapping portion 30a of the end-securing film 30. Thus the overlapping portion 30a secures the ends of the metal film 28, making it possible to reduce the stress induced at the ends of the metal film 28 due to thermal stress. The reduction in stress at the ends of the metal film 28 prevents damage to the portions of the surface electrode 26 immediately underlying these ends, making it possible to enhance the reliability of the semiconductor device 10.

Various alterations may be made to the semiconductor device of the first embodiment. For example, although in the first embodiment the end-securing film 30 is formed of polyimide, it is to be understood that the film may be a nitride film. The surface electrode 26 may be formed of any aluminum-containing material and is not limited to materials containing 95% or more of aluminum.

Second Embodiment

Figure 2:
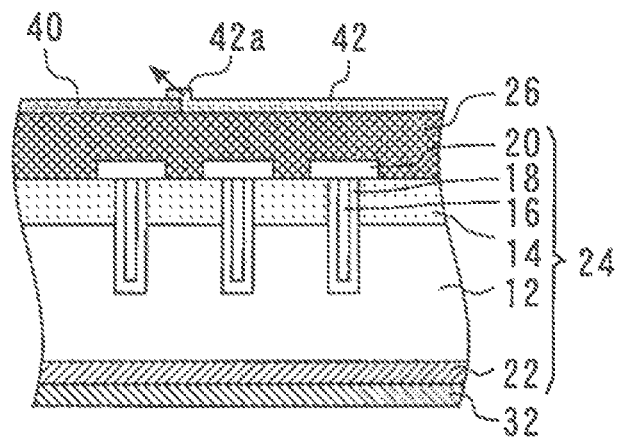
FIG. 2 is a cross-sectional view of a semiconductor device in accordance with a second embodiment of the present invention.

FIG. 2 is a cross-sectional view of a semiconductor device in accordance with a second embodiment of the present invention. Components of this semiconductor device which are identical to those of the semiconductor device of the first embodiment are designated by the same reference numerals and will not be further described herein.

The semiconductor device of the second embodiment includes a protective film 40 formed on the surface electrode 26. The protective film 40 is a nitride film. A metal film 42 is also formed on the surface electrode 26. The metal film 42 is formed of solderable material and has a portion on the surface electrode 26 and also has a riding-up portion (or overlying portion) 42a which is formed integrally with the portion on the surface electrode 26 and which overlies (or rides up on) the ends of the protective film 40.

It should be noted that the adhesion between the metal film 42 and the protective film 40 is lower than that between the surface electrode 26 and the metal film 42. Therefore, the stress induced in the metal film 42 due to thermal stress can be concentrated at the junction between the metal film 42 and the protective film 40. Specifically, the stress in the metal film 42 can be directed in the direction of the arrow of FIG. 2 (i.e., in a direction from the substrate 24 toward the riding-up portion 42a). As a result, it is possible to prevent damage to the portions of the surface electrode 26 immediately underlying the ends of the metal film 42, resulting in increased reliability of the semiconductor device.

Although in the semiconductor device of the second embodiment the protective film 40 is a nitride film, it is to be understood that it may be, e.g., a polyimide film.

Figure 3:
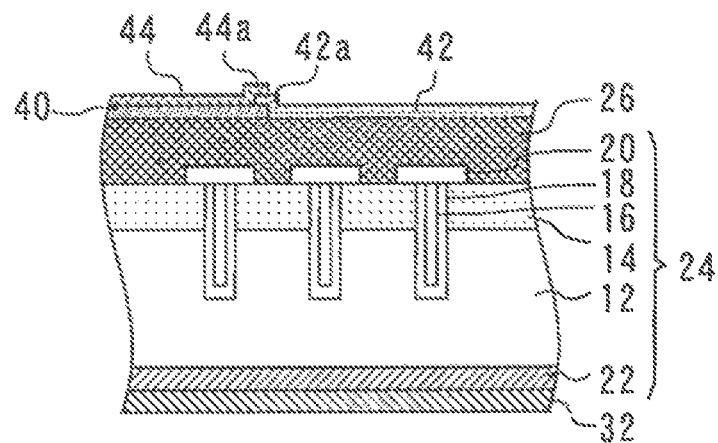
FIG. 3 is a cross-sectional view of a variation of the semiconductor device of the second embodiment.

FIG. 3 is a cross-sectional view of a variation of the semiconductor device of the second embodiment. This semiconductor device is characterized in that it is provided with an end-securing film 44 formed of polyimide. The end-securing film 44 has a portion on the protective film 40 and also has an overlapping portion 44a which is formed integrally with the portion on the protective film 40 and which overlaps the riding-up portion 42a. The end-securing film 44 is used to secure the ends of the metal film 42.

In this variation, the stress in the metal film 42 can be concentrated at the junction between the metal film 42 and the protective film 40, and furthermore the riding-up portion 42a of the metal film 42 can be secured by the overlapping portion 44a. Therefore it is possible to more effectively prevent damage to the surface electrode 26.

It should be noted that the protective film 40 may be formed of polyimide, and the end-securing film 44 may be a nitride film. Further, both the protective film 40 and the end-securing film 44 may be nitride films, or they may be formed of polyimide.

Third Embodiment

Figure 4:
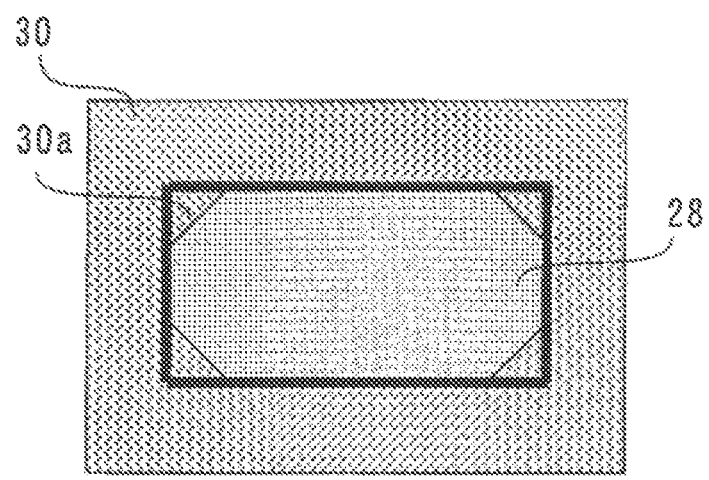
FIG. 4 is a plan view of a semiconductor device in accordance with a third embodiment of the present invention.

FIG. 4 is a plan view of a semiconductor device in accordance with a third embodiment of the present invention. The semiconductor device of the third embodiment is basically similar to that of the first embodiment, except that it is characterized by the configurations of the metal film and the overlapping portion of the end-securing film.

The metal film 28 is formed on the substrate 24 and has a (rectangular) configuration having corners. In FIG. 4, the thick solid line indicates the configuration of the metal film 28. The overlapping portion 30a of the end-securing film 30 is formed only on the corners of the metal film 28.

When a metal film, such as the metal film 28, has a configuration with corners, thermal stress tends to concentrate at these corners. Therefore, in the semiconductor device of the third embodiment, the overlapping portion 30a of the end-securing film 30 is formed on the corners of the metal film 28 so as to secure these corners. This prevents stress concentration at the corners of the metal film 28. Further, since the overlapping portion 30a is formed only on the corners of the metal film 28, a wide area of the surface of the metal film 28 can be exposed for soldering.

The semiconductor device of the third embodiment is characterized in that the corners of the metal film 28 are covered with the end-securing film 30. Therefore, the metal film may have any cornered configuration and is not limited to any particular configuration.

In the above construction of the semiconductor device of the third embodiment, a protective film, such as that described in connection with the second embodiment, may be formed between the end-securing film 30 and the surface electrode 26 and in contact with the metal film 28 in order to more effectively reduce damage to the surface electrode 26. It should be noted that the semiconductor device of the third embodiment is susceptible of at least alterations similar to those that can be made to the semiconductor devices of the first and second embodiments.

Fourth Embodiment

Figure 5A:
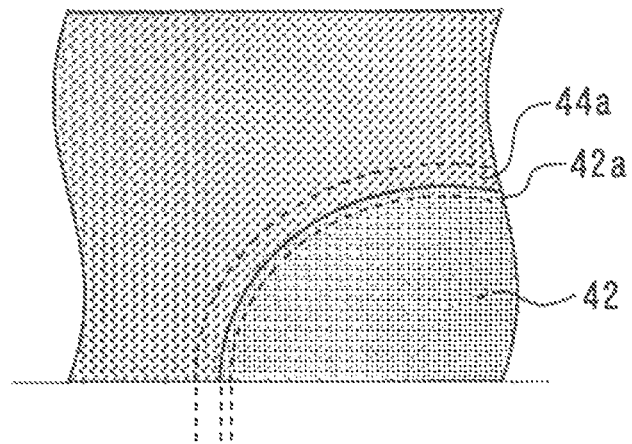
FIG. 5A is a plan view of a semiconductor device in accordance with a fourth embodiment of the present invention.
Figure 5B:
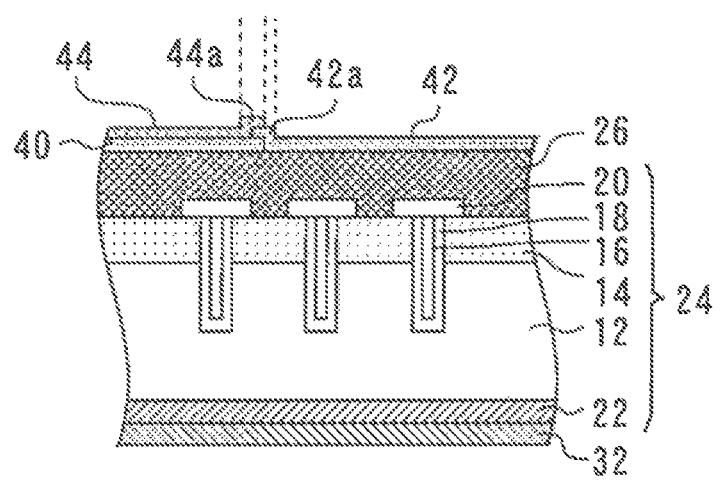
FIG. 5B is a cross-sectional view of the semiconductor device of the fourth embodiment.

FIG. 5A is a plan view of a semiconductor device in accordance with a fourth embodiment of the present invention. FIG. 5B is a cross-sectional view of the semiconductor device of the fourth embodiment. The semiconductor device of the fourth embodiment is basically similar to that described above with reference to FIG. 3, except that it is characterized by the configuration of the metal film.

The metal film 42 has a circular arc portion formed on the substrate 24. Since the metal film 42 is formed to have a circular arc configuration, the riding-up portion 42a is also formed to have a circular arc configuration. Further, the overlapping portion 44a formed on the riding-up portion 42a is also formed to have a circular arc configuration.

In the semiconductor device of the fourth embodiment, since the metal film 42 is formed to have a circular arc configuration, the stress induced in the metal film 42 due to thermal stress can be distributed to the protective film 40 and the end-securing film 44. As a result, it is possible to prevent damage to the portions of the surface electrode 26 immediately underlying the ends of the metal film 42 and thereby increase the reliability of the semiconductor device.

The metal film may have any configuration having a circular arc portion and is not limited to any particular configuration. Further, in the semiconductor devices shown in FIGS. 1, 2, and 4, the metal film may be formed to have a configuration having a circular arc portion so as to distribute the stress in the metal film. It should be noted that the semiconductor device of the fourth embodiment is susceptible of at least alterations similar to those that can be made to the semiconductor devices of the first and second embodiments.

In accordance with the present invention it is possible to reduce stress at the ends of a metal film in a semiconductor device and thereby maintain the reliability of the device.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2011-122135, filed on May 31, 2011 including specification, claims, drawings and summary, on which the Convention priority of the present application is based, are incorporated herein by reference in its entirety.

What is claimed is:

1. A semiconductor device comprising:
    a substrate;
    a surface electrode of aluminum-containing material formed on said substrate;
    a metal film of solderable material formed on said surface electrode; and
    an end-securing film securing an end of said metal film, the end-securing film having a flat portion in direct contact with said surface electrode and also having a non-flat overlapping portion that rises up in an upward direction, said non-flat overlapping portion formed integrally with said flat portion on said surface electrode and which overlaps only each corner of said metal film.

2. The semiconductor device according to claim 1, wherein:
    said metal film is formed above said substrate and has a rectangular configuration.

3. The semiconductor device according to claim 1, wherein said metal film has a circular arc portion formed on said substrate.

4. The semiconductor device according to claim 1, wherein a thickness of said flat portion is equal to a thickness of said non-flat overlapping portion.

5. A semiconductor device comprising:
    a substrate;

a surface electrode of aluminum-containing material formed on said substrate;

a protective film formed on said surface electrode;

a metal film formed of solderable material and having a flat portion in direct contact with said surface electrode and also having a non-flat portion which is formed integrally with said flat portion of said metal film on said surface electrode and which overlies an end of said protective film; and an end-securing film securing the non-flat portion of said metal film, the end-securing film having a flat portion in contact with said protective film and also having a non-flat overlapping portion that rises up in an upward direction, said non-flat overlapping portion integrally formed with said flat portion of the end-securing film on said protective film and which overlaps only each corner of said metal film, and is in direct contact with a top side of said non-flat portion of said metal film.

6. The semiconductor device according to claim 5, wherein said protective film is a polyimide film or a nitride film selected to have an adhesion with the metal film that is lower than an adhesion between the surface electrode and the metal film.

7. The semiconductor device according to claim 5, wherein a thickness of said flat portion is equal to a thickness of said non-flat overlapping portion.

* * * * *